(12) United States Patent
Keeth

(10) Patent No.: US 6,295,618 B1
(45) Date of Patent: *Sep. 25, 2001

(54) METHOD AND APPARATUS FOR DATA COMPRESSION IN MEMORY DEVICES

(75) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/139,838

(22) Filed: Aug. 25, 1998

(51) Int. Cl.$^7$ .................................................. G11C 29/00
(52) U.S. Cl. ........................ 714/718; 714/719; 714/722
(58) Field of Search .................... 714/718, 719, 714/720, 722, 723, 724; 365/200, 201, 202

(56) References Cited

U.S. PATENT DOCUMENTS

| | | | |
|---|---|---|---|
| 4,991,139 | * 2/1991 | Takahashi et al. | 365/201 |
| 5,029,330 | 7/1991 | Kajigaya | 365/201 |
| 5,179,537 | * 1/1993 | Matsumoto | 365/201 |
| 5,268,639 | 12/1993 | Gasbarro et al. | 324/158 R |
| 5,289,415 | 2/1994 | DiMarco et al. | 365/190 |
| 5,305,272 | 4/1994 | Matsuo et al. | 365/208 |
| 5,451,898 | 9/1995 | Johnson | 327/563 |
| 5,488,321 | 1/1996 | Johnson | 327/66 |
| 5,519,661 | 5/1996 | Miura | 365/205 |
| 5,621,340 | 4/1997 | Lee et al. | 327/65 |
| 5,684,750 | 11/1997 | Kondoh et al. | 365/205 |
| 5,708,607 | 1/1998 | Lee et al. | 365/189.05 |
| 5,809,038 | 9/1998 | Martin | 371/21.2 |
| 5,923,594 | * 7/1999 | Voshell | 365/189.05 |
| 5,935,263 | 8/1999 | Keeth et al. | 371/21.1 |

(List continued on next page.)

FOREIGN PATENT DOCUMENTS

| | | | |
|---|---|---|---|
| 0 283 906 A1 | 9/1988 | (EP) | G11C/29/00 |
| 0 828 252 A2 | 3/1998 | (EP) . | |
| 0 840 328 A2 | 5/1998 | (EP) | G11C/29/00 |

OTHER PUBLICATIONS

Descriptive literature entitled, "400MHz SLDRAM, 4M×16 SLDRAM Pipelined, Eight Bank, 2.5 V Operation," SLDRAM Consortium Advance Sheet, published throughout the United States, pp. 1–22.

(List continued on next page.)

*Primary Examiner*—Albert Decady
*Assistant Examiner*—Samuel Lin
(74) *Attorney, Agent, or Firm*—Dorsey & Whitney LLP

(57) ABSTRACT

A test circuit for a memory device having a pair of arrays each of which includes a plurality of memory cells arranged in rows and columns. A pair of complementary digit lines is provided for each column of each array. The digit lines are selectively coupled to a pair of I/O lines for each array which are, in turn, coupled to a pair of complementary data lines. The data lines are coupled to respective inputs of a DC sense amplifier, one of which is provided for each array. A multiplexer connects the pair of I/O lines for either one of the arrays to the data lines in a normal operating mode. Thus, in the normal operating mode, data are selectively coupled to the inputs of the DC sense amplifier from the complementary digit lines for an addressed column. In a test mode, the multiplexer connects the I/O lines for both arrays to the data lines to compress the data from the two arrays. Combinatorial logic then determines if both of the data lines have the same logical value, indicating disagreement between the data from the memory arrays that may indicate the presence of a defective memory cell in one or the other array. Thus, in the test mode, data are simultaneously coupled to the inputs of the DC sense amplifier from respective digit lines coupled to two different memory cells, thereby increasing the rate at which background data that has been written to the arrays can be read from the arrays.

55 Claims, 6 Drawing Sheets

U.S. PATENT DOCUMENTS

| | | | | |
|---|---|---|---|---|
| 5,953,266 | * | 9/1999 | Shore | 365/200 |
| 5,959,921 | | 9/1999 | Manning et al. | 365/208 |
| 6,005,816 | | 12/1999 | Manning et al. | 365/208 |
| 6,032,274 | | 2/2000 | Manning | 371/21.1 |
| 6,043,562 | * | 3/2000 | Keeth | 257/776 |
| 6,055,654 | | 4/2000 | Martin | 371/21.2 |
| 6,067,651 | * | 5/2000 | Rohrbaugh et al. | 714/738 |
| 6,079,037 | * | 6/2000 | Beffa et al. | 714/720 |

OTHER PUBLICATIONS

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc. New York, NY, pp. 1–55.

Taguchi, M. et al., "A 40–ns 64–Mb DRAM with 64–b Parallel Data Bus Architecture," IEEE Journal of Solid–State Circuits, vol. 26, No. 11, Nov. 1991, pp. 1493–1497.

Taguchi, M. et al., "A 40ns 64Mb DRAM with Current–Sensing Data–Bus Amplifier," ISSCC Digest of Technical Papers, 1991, TAM 6.5.

Ishibashi, K. et al, "A 6–ns 4–Mb CMOS SRAM with Offset–Voltage–Insensitive Current Sense Amplifiers," IEEE Journal of Solid–State Circuits, vol. 30, No. 4, Apr. 1995, pp. 728–733.

Kuroda, T. et al., "Automated Bias Control (ABC) Circuit for High–Performance VLSI's," IEEE Journal of Solid–State Circuits, vol. 27, No. 4, Apr. 1992, pp. 539–545.

Nagai, T. et al., "A 17–ns 4–Mb CMOS DRAM," IEEE Journal of Solid State Circuites, vol. 26, No. 11, Nov. 1991, pp. 1538–1543.

* cited by examiner

US 6,295,618 B1

METHOD AND APPARATUS FOR DATA COMPRESSION IN MEMORY DEVICES

TECHNICAL FIELD

This invention relates to integrated circuit memory devices, and, more particularly, to a method and apparatus for reading data from memory devices in a compressed manner to expedite testing of memory devices.

BACKGROUND OF THE INVENTION

Integrated circuits are extensively tested both during and after production and, in some cases, routinely during use after they have been installed in products. For example, memory devices, such as dynamic random access memories ("DRAMs"), are tested during production at the wafer level and after packaging, and they are also routinely tested each time a computer system using the DRAMs executes a power up routine when power is initially applied to the computer system. DRAMs are generally tested by writing known data to each location in the memory, reading data from each memory location and then determining if the read data matches the written data. As the capacity of DRAMs and other memory devices continues to increase, the time required to write and then read data from all memory locations continues to increase, even though memory access times continue to decrease.

Various proposals have been made to decrease the time required to test memory devices, such as DRAMs. The time required to write known data to memory devices has been reduced by such approaches as simultaneously writing the same data to each column of each array in the memory device one row at a time. Other approaches include internal circuitry for transferring data from each column of one row to the next without requiring the memory to be addressed. These approaches have reduced the time required to write known data or a known pattern of data to the memory array.

Solutions have also been proposed for reducing the time required to read data from memory devices so that the data can be compared to the data written to the memory devices. One approach to solving the problem of excessive read times relies on data compression in which data from a direct current sense amplifier for one memory array are internally compared to the data from a sense amplifier of a different memory array. Simultaneously reading data from different memory locations in two different arrays has significantly reduced the time required to read data from memory devices for test purposes. However, combining data from multiple sense amplifiers requires the addition of circuitry and conductors to couple the outputs of the multiple sense amplifiers to comparison circuitry. As the circuit features of semiconductor devices become more densely packed, there is less space available to route conductors from each sense amplifier to a single location and to provide additional circuitry to combine the outputs of the direct current sense amplifiers.

There is therefore a need to be able to read data from a memory device in a compressed form to reduce testing time that can be implemented on integrated circuits having very densely packed circuit features.

SUMMARY OF THE INVENTION

In accordance with one aspect of the present invention, a test circuit is included in a memory device having at least one array or bank of memory cells arranged in rows and columns, a pair of complementary digit lines for each column and a direct current sense amplifier that couples data from a digit line selected by a column address to an external data terminal of the memory device. In accordance with one aspect of the invention, the test circuit includes a direct current sense amplifier that also provides a wired-OR function, combining data from several digit lines to one set of complementary I/O lines. When data from one memory cell differs from data from another cell and these data are being combined, both of the complementary I/O lines are low, and a detector circuit produces a "fail" signal. As a result, data can be read from the array in compressed fashion, e.g. from two columns at a time, thereby increasing the rate at which the memory array can be tested after background data have been written to the array. Although the memory device may have only a single memory array, it may also have multiple arrays, in which case columns from different arrays may be coupled to the inputs of a DC sense amplifier in the test mode. The coupling between the inputs of the DC sense amplifier and the digit lines is preferably through a pair of data lines coupled to the inputs of the DC sense amplifier, a pair of I/O lines for each of the arrays to which the digit lines of an addressed column are connected and a multiplexer selectively coupling two of the I/O lines to the data lines.

In accordance with an aspect of the invention, the test circuit may be used in a memory device that is connected to a test system. In such case, the test system may first write a known pattern of background data to the array followed by reading data from pairs of different columns of the memory device, as explained above. The read data are then examined to determine if the read data correspond to the pattern of background data written to the array, thereby providing an indication of whether the memory device is operating properly.

DETAILED DESCRIPTION OF THE INVENTION

Figure 1:
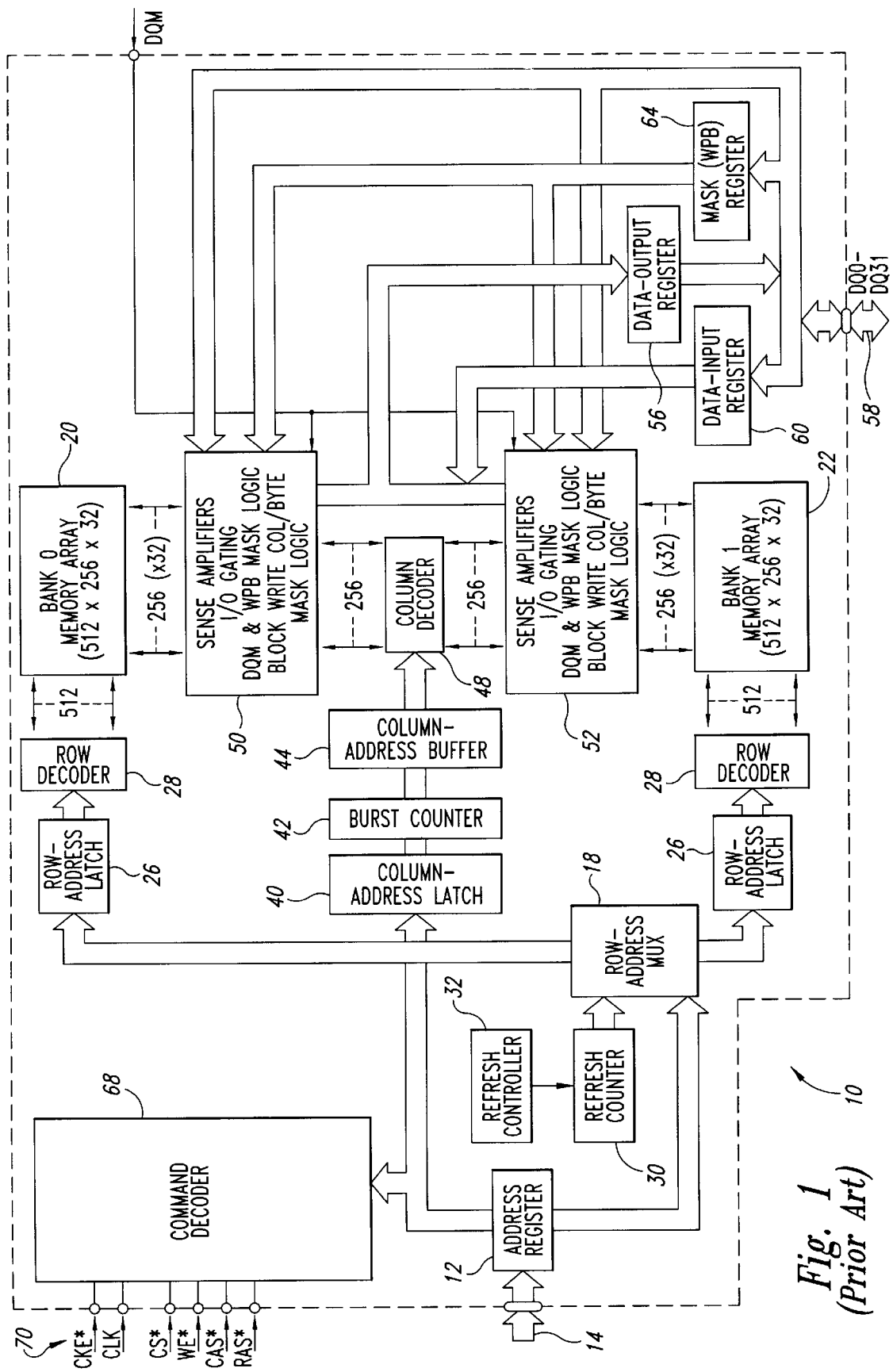
FIG. 1 is a simplified block diagram of a conventional memory device that may use an embodiment of a test circuit in accordance with the present invention.

An embodiment of a memory device that can advantageously use an embodiment of a test circuit in accordance with the present invention is illustrated in FIG. 1. The memory device shown in FIG. 1 is a synchronous dynamic random access memory ("SDRAM") 10, although the test circuit may also be used in other DRAMs and other memory devices. The SDRAM 10 includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22, depending upon the state of a bank address bit forming part of the row address. Associated with each of the memory banks 20, 22 is a respective row address latch 26, which stores the row address, and a row decoder 28, which applies various signals to its respective memory bank 20 or 22 as a function of the stored row address. The row address multiplexer 18 also couples row addresses to the row address latches 26 for the purpose of refreshing the memory cells in the memory banks 20, 22. The row addresses are generated for refresh purposes by a refresh counter 30, which is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42, which applies a sequence of column addresses to the column address buffer 44 starting at the column address that is stored in the column-address latch. In either case, the column address buffer 44 applies a column address to a column decoder 48, which applies various column signals to respective sense amplifiers and associated column circuitry 50, 52 for the respective memory banks 20, 22.

Data to be read from one of the memory banks 20, 22 are coupled to the column circuitry 50, 52 for one of the memory banks 20, 22, respectively. The data are then coupled to a data output register 56, which applies the data to a data bus 58. Data to be written to one of the memory banks 20, 22 are coupled from the data bus 58 through a data input register 60 to the column circuitry 50, 52 and then are transferred to one of the memory banks 20, 22, respectively. A mask register 64 may be used to selectively alter the flow of data into and out of the column circuitry 50, 52, such as by selectively masking data to be read from the memory banks 20, 22.

The above-described operation of the SDRAM 10 is controlled by a command decoder 68 responsive to high level command signals received on a control bus 70. These high level command signals, which are typically generated by a memory controller (not shown in FIG. 1), are a clock enable signal CKE*, a clock signal CLK, a chip select signal CS*, a write enable signal WE*, a column address strobe signal CAS*, and a row address strobe signal RAS*, with the "*" designating the signal as active low or complement. The command decoder 68 generates a sequence of control signals responsive to the high level command signals to carry out the function (e.g., a read or a write) designated by each of the high level command signals. These control signals, and the manner in which they accomplish their respective functions, are conventional. Therefore, in the interest of brevity, a further explanation of these control signals will be omitted.

It will be appreciated that while this discussion mentions only two memory banks 20, 22, four, eight etc. memory banks 20, 22 may be coupled together to provide a greater degree of data compression. It will also be appreciated that, while this discussion is in terms of compressing data from multiple memory banks, data from multiple columns (or rows) within one memory bank may be compressed in a similar manner. In one embodiment, the memory cells providing the data that are compressed are also memory cells that would be replaced as a group by rows or columns of redundant or spare memory cells (not illustrated). In this embodiment, there is no need to test the memory banks 20, 22 individually because, when a memory cell at one location is replaced with a first redundant memory cell, a corresponding memory cell in another location will be automatically replaced by a second redundant memory cell.

In another embodiment, when testing determines from the compressed data that a memory cell in at least one of the memory banks 20, 22 is defective, individual testing of the memory cells in each memory bank 20, 22 allows more precise identification of the defective memory cell without substantial compromise of testing speed.

Figure 2:
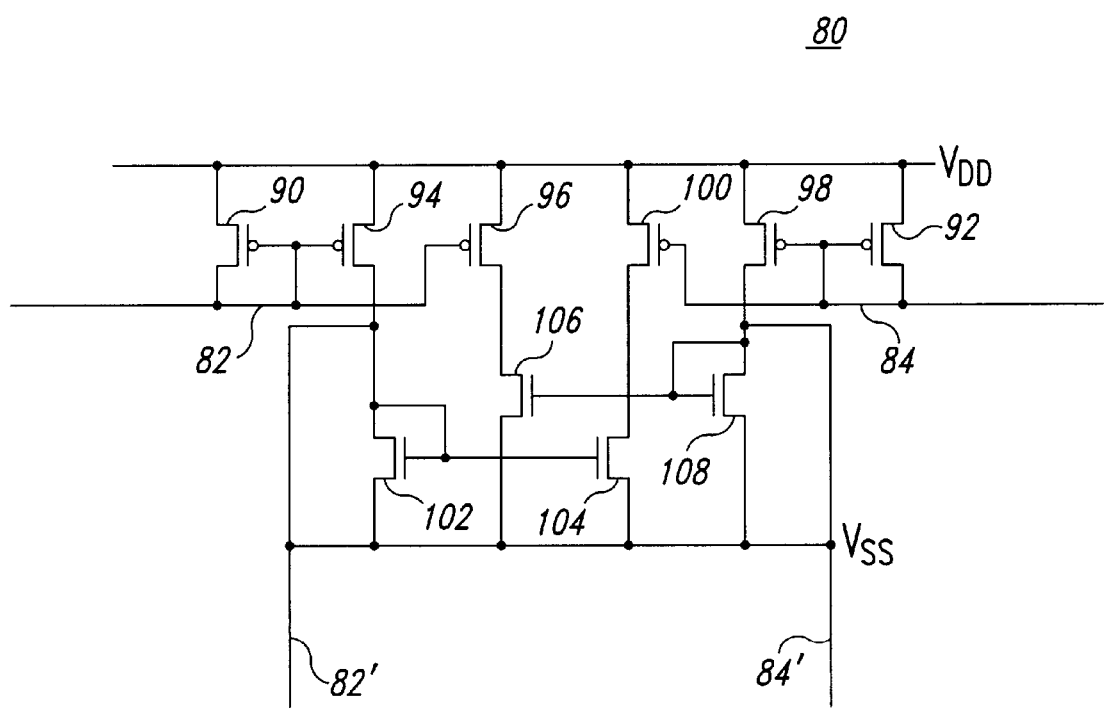
FIG. 2 is a simplified schematic diagram of a prior art DC sense amplifier than can be used with an embodiment of the present invention.

FIG. 2 is a simplified schematic diagram of a DC sense amplifier 80 that can be used with an embodiment of the present invention. The DC sense amplifier 80 is of a type described in "A 40-ns 64-Mb DRAM with 64-b Parallel Data Bus Architecture" by M. Taguchi et al., *IEEE Journal of Solid State Circuits*, Vol. 26, No. 11, Nov. 1991 and includes inputs 82, 84' coupled to PMOS transistors 90 and 92, each having a source and gate coupled to a respective one of the inputs 82, 84. The transistor 90 is coupled to transistors 94, 96 in a current mirror configuration that provides a first current gain $\alpha_1$ for a signal current $I_1$ on the input 82. The transistor 92 is coupled to transistors 98, 100 in a current mirror configuration also providing the first current gain $\alpha_1$ for a signal current $I_2$ on the input 84.

NMOS transistors 102 and 104 form another current mirror amplifier having a current gain $\alpha_2$. An output current $I_{OUT}$ on the output 82' is thus $I_{OUT} = \alpha_1 I_1 - \alpha_1 \alpha_2 I_2$, and an output current $I_{OUT}*$ on the output 84' is described similarly, but with $I_1$ and $I_2$ interchanged. This type of DC sensing amplifier 80 provides high current sensitivity, which is advantageous when the added capacitance of additional digit lines and I/O lines is coupled to the inputs 82, 84. This type of direct current sense amplifier 80 also biases the inputs 82, 84 towards Vcc. As a result, a wired-OR function may be realized by simply coupling two or more open-drain FETs to one of the inputs 82, 84 to the DC sense amplifier 80.

Figure 3:
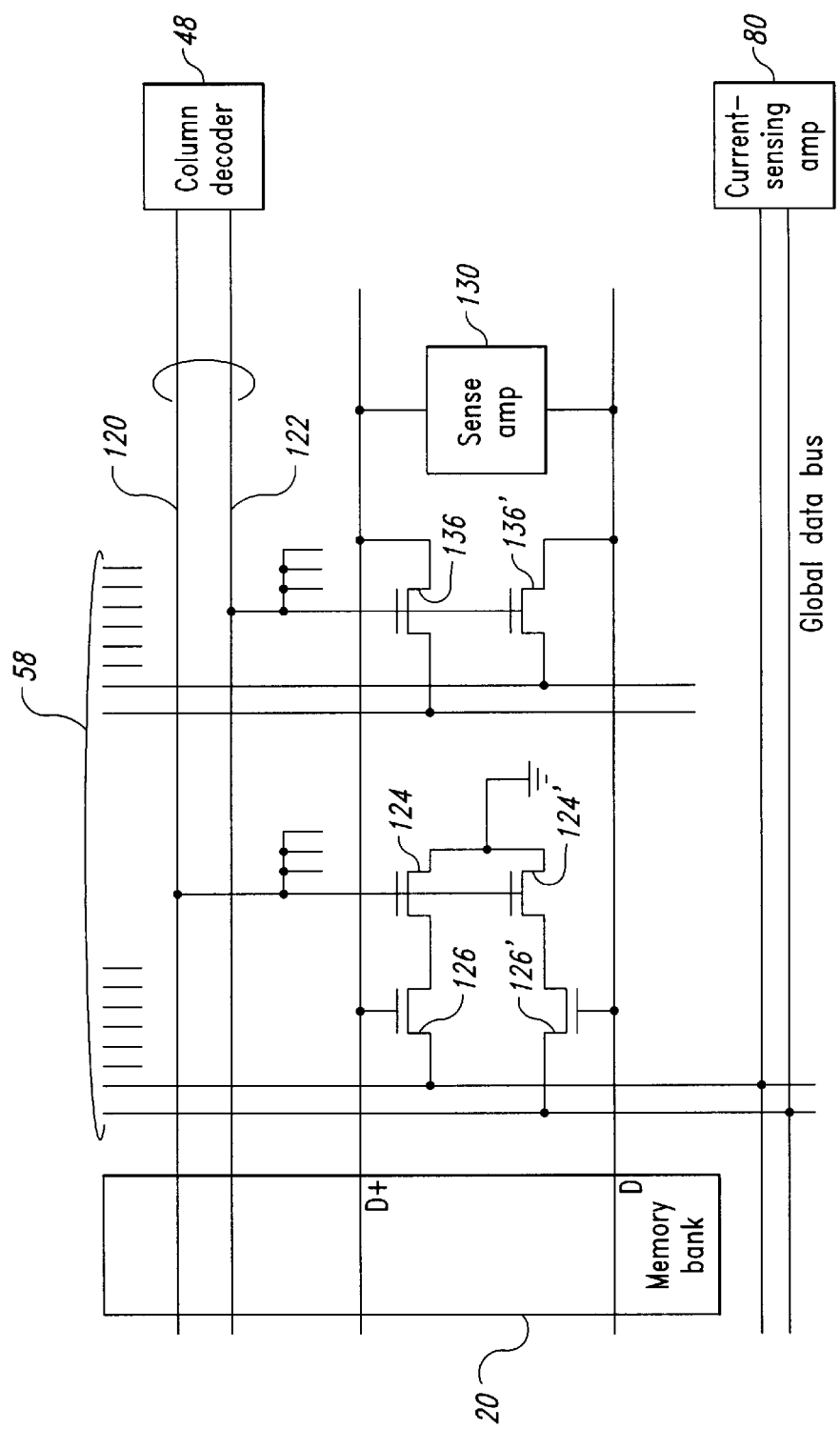
FIG. 3 is a simplified schematic diagram of a portion of a memory device in accordance with an embodiment of the present invention.

FIG. 3 is a simplified schematic diagram of a portion of a memory device 10 in accordance with an embodiment of the present invention. In operation, the column decoder 48 selects a column by activating either a read line 120 or a write line 122. The read line 120 is coupled to gates of isolation transistors 124, 124'. The isolation transistors 124, 124' have sources coupled to ground and each has a drain coupled to a source of one of digit line read transistors 126, 126'. The digit line read transistors 126, 126' include gates coupled to digit lines D+ and D, respectively. As a result, a sense amplifier 130 (FIG. 4) can read data from a memory cell (not shown) in the memory bank 20 through the digit lines D, D+, and couple the data from the memory cell to the data bus 58. Similarly, data from the data bus S8 can be written to the memory cell when the column decoder 48 activates the write line 122 to turn on the write isolation transistors 136, 136'.

Because the digit line read transistors 126, 126' have drains coupled to the data bus 58, and the DC current sensing amplifier 80 of FIG. 2 supplies a pull-up bias at the inputs 82, 84, which are also coupled to the data bus S8, drains of multiple digit line read transistors 126, 126' corresponding to different memory cells can be coupled together to one of the inputs 82, 84 to provide a wired-OR function. As a result, data from multiple memory cells may be compressed, allowing multiple memory cells to be read simultaneously.

Figure 4:
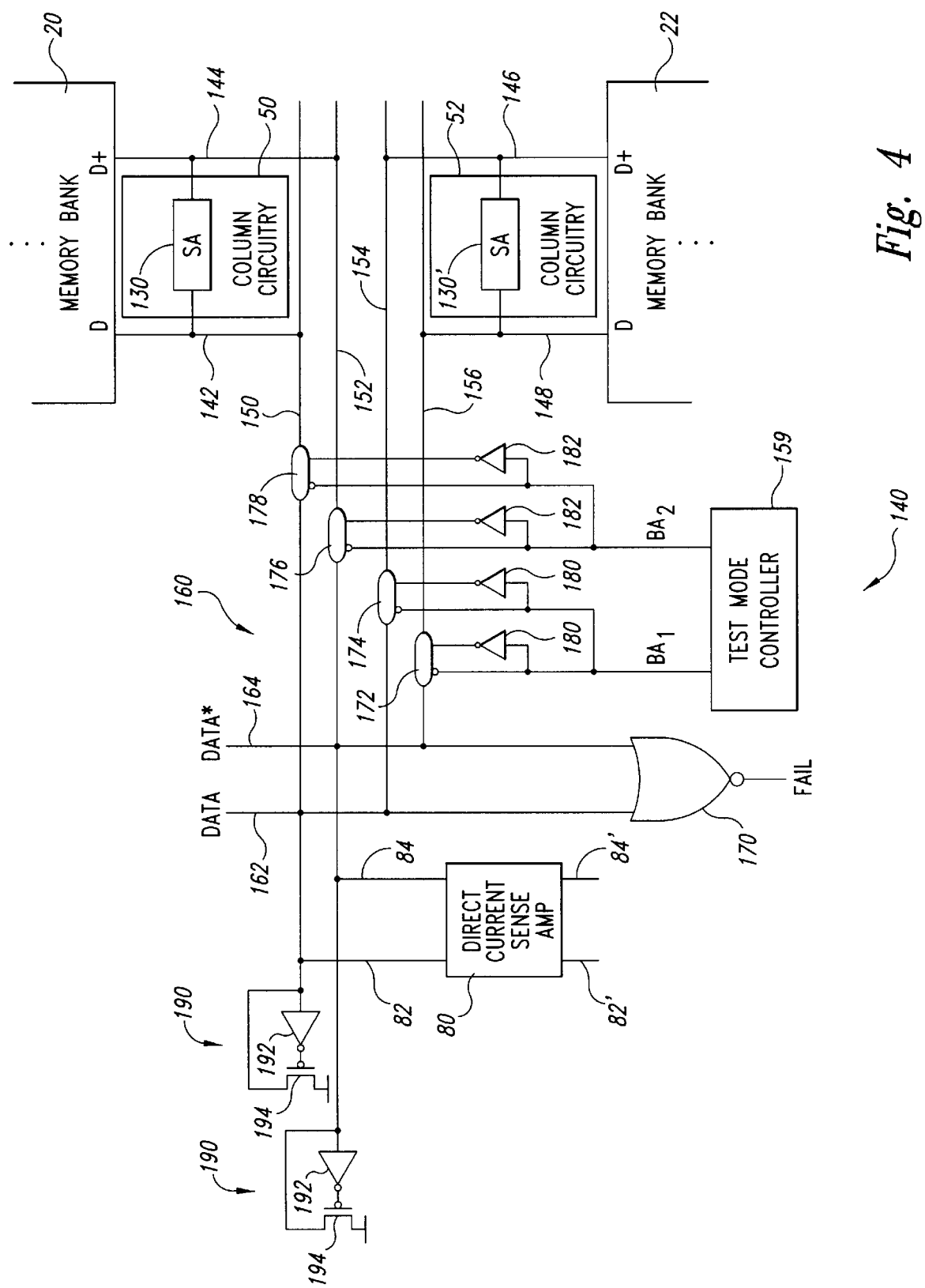
FIG. 4 is a block diagram of a portion of the memory device of FIG. 1 including a test circuit in accordance with an embodiment of the present invention.

FIG. 4 is a block diagram of a portion of the memory device 10 of FIG. 1 including a test circuit 140 in accordance with an embodiment of the present invention. To understand the inventive test circuit 140, it is best to have an understanding of a portion of the circuitry conventionally used in the column circuitry 50, 52 in the SDRAM 10 of FIG. 1. With reference to FIG. 4, the column circuitry 50, 52 for each of the memory banks 20, 22 typically includes one of the sense amplifiers 130, 130' for each column in each memory bank 20, 22, respectively. The sense amplifiers 130, 130' each receive signals from, and apply signals to, a pair of complementary digit lines 142, 144 and 146, 148, respectively. Thus, for example, when data being read from a column in memory bank 20 is "1," the digit line 142 will be at a logic "1" and the complementary digit line 144 will be at a logic "0."

As mentioned above, many sense amplifiers 130, 130' are provided for each array 20, 22, respectively. In one embodiment, the digit lines 142, 144 and 146, 148 of each sense amplifier 130, 130' are selectively applied to complementary I/O lines 150, 152 and 154, 156 by column addressing circuitry 160. There is one pair of I/O lines 150, 152 and 154, 156 for each segment of the arrays 20, 22, respectively. In operation, when the column for which the sense amplifier 130 is provided is addressed, the digit lines 142, 144 are coupled to the I/O lines 150, 152, respectively, by the column addressing circuitry in the column circuitry 50 (see FIGS. 1 and 3). Similarly, when the column to which the sense amplifier 130' is coupled is addressed, the digit lines 146, 148 are coupled to the complementary I/O lines 154, 156, respectively, by the column addressing circuitry in the column circuitry 52 (FIG. 1).

In response to signals from a test mode controller 159, the column select circuitry 160 selectively couples the I/O lines 150–156 to a pair of complementary data lines 162, 164 that in turn are coupled to inputs of a NOR gate 170. The column select circuitry 160 is formed by multiplexers 172, 174, 176 and 178 and inverters 180 and 182. The sense amplifiers 130, 130' of FIGS. 1 and 4 have previously been turned on. Each line of each pair of I/O lines 150–156 is thus at a voltage of either Vcc or ground and is coupled to an input of multiplexers 172–178.

In another embodiment, only the columns of interest are turned on. As a result, the column addressing circuitry 160 is not required, and I/O lines 150 and 154 are both coupled to the data line 162. Similarly, the I/O lines 152 and 156 are both coupled to the data line 164.

As a result, in either embodiment, a wired-OR function is realized when, e.g. I/O lines 150, 154 are coupled to a common node that includes a pullup current source, such as the inputs 82. 84 to the DC sense amplifier 80 of FIG. 2. Thus, when the data being read out from the memory banks 20, 22 differ, both of the data lines 162, 164 will be at logic "0." The data lines 162, 164 are, in turn, coupled to the inputs 82. 84 of the DC sense amplifier 80 having complementary output terminals 82', 84' that are normally coupled to or part of the data output register 56 (FIG. 1). When both of the data lines 162, 164 are at logic "0," this is detected by the NOR gate 170, and a logic "1" on the line FAIL coupled to an output of the NOR gate 170 indicates that one of the memory banks 20, 22 includes a defective memory cell.

In a normal mode of operation, the column decoder 48 selects only one column at a time. In a test mode of operation in accordance with an embodiment of the invention, multiple columns are active at the same time. In one embodiment, a wired-OR function compresses data from both memory banks 20, 22 by coupling both sets of I/O lines 150, 152 and 154, 156 to the DC sense amplifier 80. When the same data have been written to both memory banks 20. 22, but the read data from the two memory banks 20, 22 are different, both data lines 162, 164 will go to logic "0."

It will be appreciated that combinatorial logic may be used to detect failed memory cells, even in memories having very wide data paths that may be coupled to other circuitry in a manner different that that shown in FIG. 4, e.g., not necessarily having I/O lines and data lines.

In one embodiment, weak latches 190 are coupled to each of the data lines 162, 164. A weak latch 190 is provided by coupling the input of an inverter 192 to one of the data lines 162. 164 and the output of that inverter 192 to the gate of a PMOS transistor 194 having a source coupled to ground and a drain coupled to that data line 162, 164. The weak latches 190 may be set or reset in response to changes in the data presented on the data lines 162, 164. The PMOS transistor 194 allows the latch 190 to be set or reset by signal sources having more robust signal assertion capabilities.

In operation, the SDRAM 10 is tested by first writing known data to the memory banks 20, 22 by conventional means. The data may be written by addressing individual memory cells or by using conventional approaches for writing data to the memory banks 20, 22 for test purposes, as explained above. For example, a logic "1" may be written to each memory cell in the memory banks 20, 22 so that when the data are read, the non-complementary digit lines 144, 146 will be logic "1" and the complementary digit lines 142., 148 will be logic "0." Under these circumstances, the DC sense amplifier 80 will receive the same signals as when reading a logic "1" from a memory cell (i.e., D="1" and D*="0") thereby generating a logic "1" on its output terminal 82' and a logic "0" on its output terminal 84'. However, it will be understood that logic "0" may be written to all memory cells in the memory banks 20, 22, or data in some other pattern, such as a checkerboard pattern, may be written to the memory banks 20, 22. In any case, as long as the data are written to the memory banks 20, 22 in a known pattern, the compressed data applied to the DC sense amplifier 80 and the NOR gate 170 can provide an indication of whether the memory cells in the memory banks 20, 22 are operating properly. However, the data written to the memory banks 20, 22 must be selected so that, when the data is read from the memory banks 20, 22, the data and data* will be at complementary logic levels.

Figure 5:
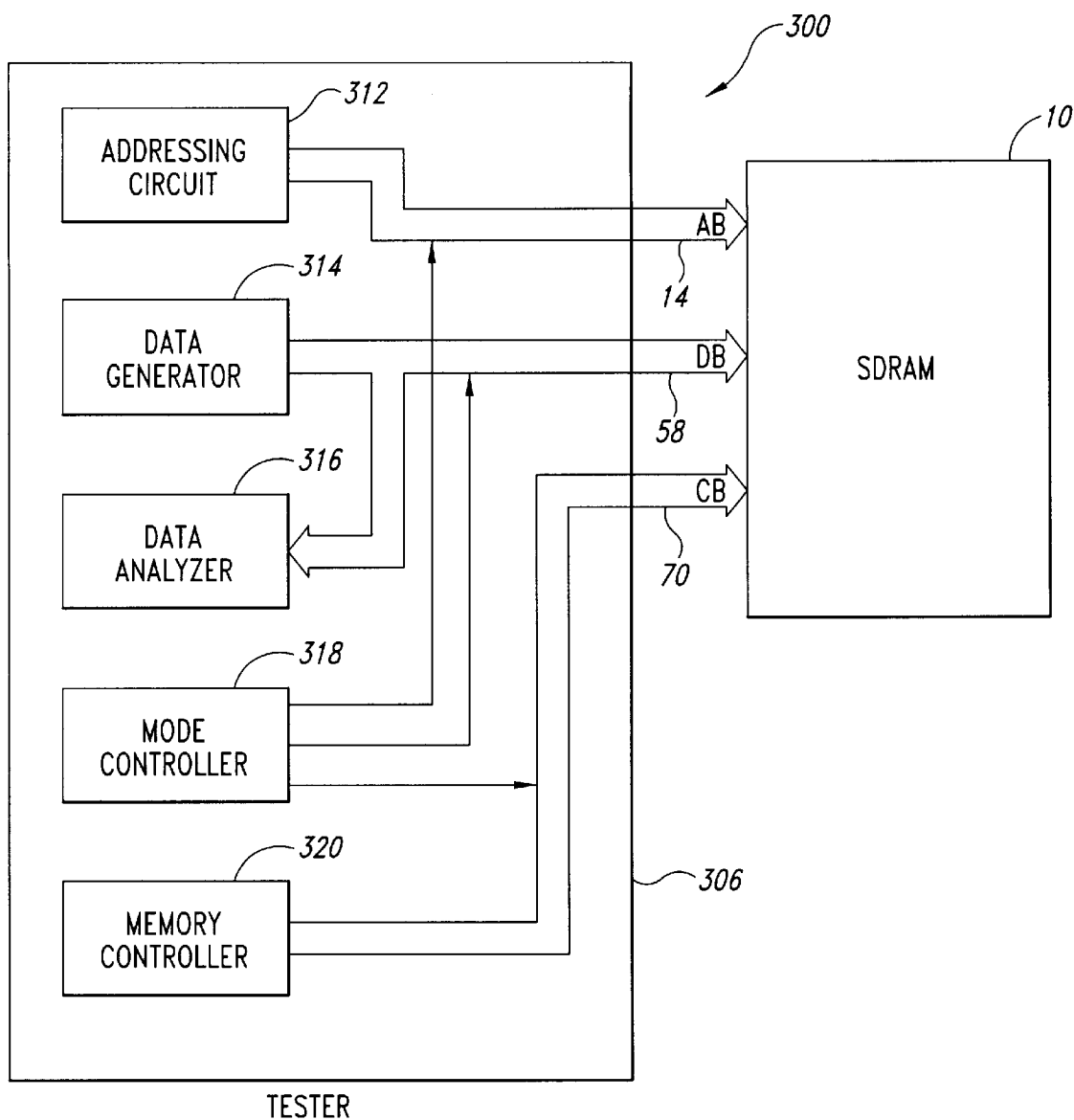
FIG. 5 is a block diagram of the memory device of FIGS. 1 and 4 used with a test system to determine whether the memory device is operating properly in accordance with embodiments of the present invention.

A testing system 300 for testing the SDRAM 10 containing the test circuit 140 of FIG. 4 is shown in FIG. 5, in accordance with an embodiment of the present invention. The SDRAM 10 is connected through its address bus 14, data bus 58 and control bus 70 to a tester 306. The tester 306 includes an addressing circuit 312 connected to the address bus 14, a data generator 314 connected to the data bus 58, a data analyzer 316 also connected to the data bus 58, a mode controller 318 connected to a plurality of externally accessible terminals of the SDRAM 10 in one or more of the buses 14, 58, 70, and a memory controller 320 providing control signals to the SDRAM 10 on the control bus 70.

In operation, the data generator 314 applies predetermined data to the data bus 58 while the addressing circuit 312 applies suitable addresses to the address bus 14 to cause the data on the bus 58 to be written into the SDRAM 10 under control of the memory controller 320. During this time, the mode controller 318 generates and applies combinations of signals to the external terminals of the SDRAM 10 to cause the test mode controller 132 to generate the bank addressing signals as desired. After data have been written to the memory banks 20, 22, the mode controller 318 generates a combination of signals to cause the test mode controller 159 (FIG. 4) to place the test circuitry 140 in the test mode. The addressing circuitry 312 then addresses the memory cells of the memory banks 20, 22 under control of the memory controller 320 to apply compressed data to the DC sense amplifier 80. The resulting data signals at the output terminals 82', 84' of the DC sense amplifier 80 are coupled through the data bus 58 to the data analyzer 316. The data analyzer 316 determines whether the data read from the SDRAM 10 corresponds to the data written to the SDRAM 10. Although the test system 300 is shown as being used to test an SDRAM 10, it will be understood that it may be used to test other types of DRAMs and other types of memory devices.

The addressing circuits 312, data generator 314, data analyzer 316, mode controller 318, and memory controller 320 can be implemented by a variety of means with relative ease by one skilled in the art. For example, these components can be implemented in software executed by a computer system. Alternatively, the addressing circuit 312 can be implemented by a counter that outputs incrementally increasing addresses. The data generator 314 can be implemented by a set of pull-up resistors that simply hold the lines of the data bus 58 at logic "1." The data analyzer 316 can be implemented by a latch that detects a predetermined logic level. The mode controller 318 can be implemented by a logic circuit that generates predetermined combinations of signals. The memory controller 320 can be implemented by a conventional memory controller. The tester 306 and its internal components are preferably controlled by a conventional computer system (not shown).

Figure 6:
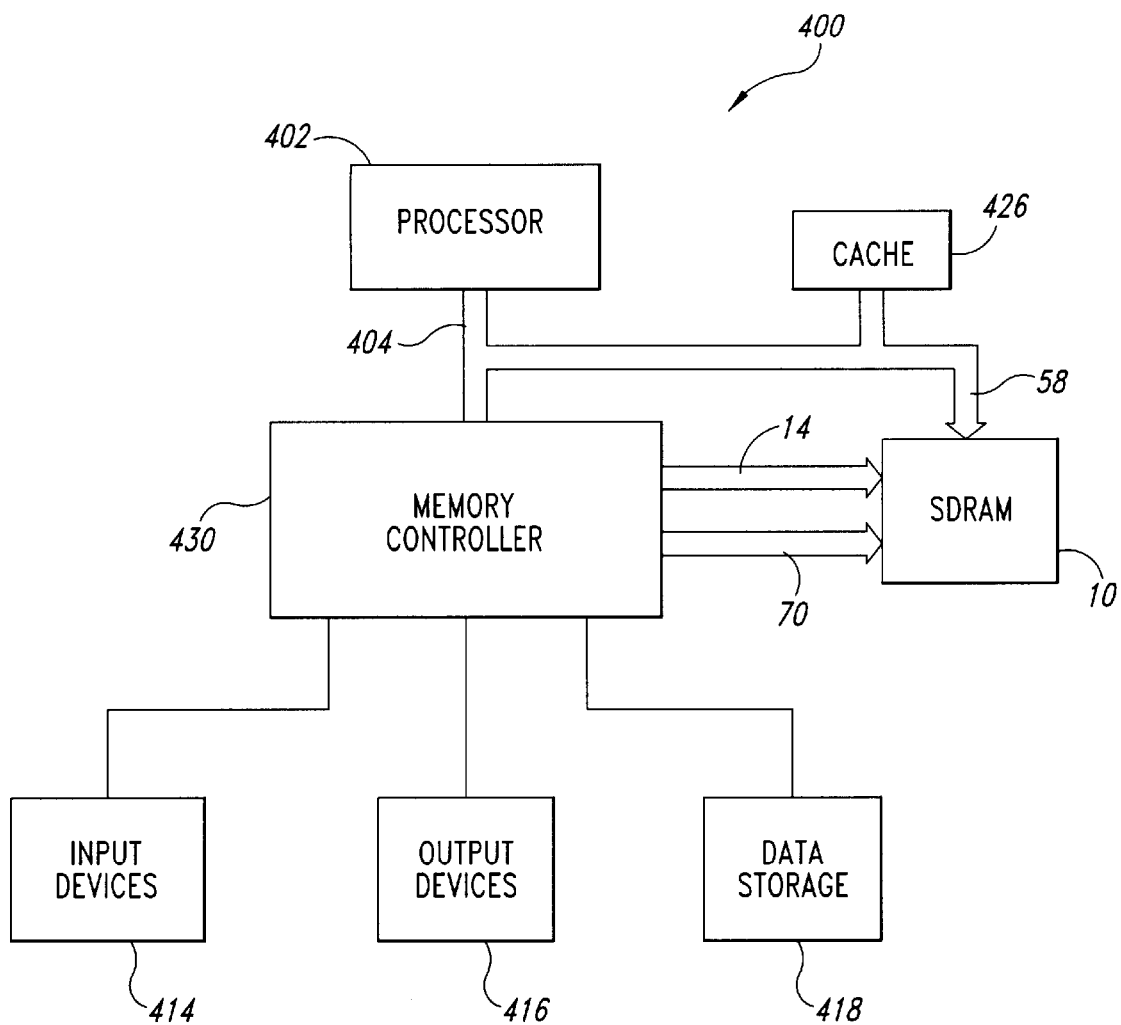
FIG. 6 is a block diagram of a computer system using the memory device of FIGS. 1 and 4 in accordance with an embodiment of the invention.

FIG. 6 is a block diagram of a computer system 400 which includes the SDRAM 10 of FIGS. 1, 3 and 4. The computer system 400 includes a processor 402 for performing various computing functions, such as executing specific software to perform specific calculations or tasks. The processor 402 includes a processor bus 404 that normally includes the address bus 14, the data bus 8, and the control bus. In addition, the computer system 400 includes one or more input devices 414, such as a keyboard or a mouse, coupled to the processor 402 to allow an operator to interface with the computer system 400. Typically, the computer system 400 also includes one or more output devices 416 coupled to the processor 402, such output devices typically being a printer or a video terminal. One or more data storage devices 418 are also typically coupled to the processor 402 to allow the processor 402 to store data or retrieve data from internal or external storage media (not shown). Examples of typical storage devices 418 include hard and floppy disks, tape cassettes and compact disk read-only memories (CD-ROMs). The processor 402 is also typically coupled to cache memory 426, which is usually static random access memory ("SRAM") and to the SDRAM 10 through a memory controller 430. The memory controller 430 normally includes the control bus 70 and the address bus 14 that is coupled to the SDRAM 10. The data bus 58 may be coupled to the processor bus 404 either directly (as shown), through the memory controller 430, or by some other means.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

What is claimed is:

1. In a memory device:
   at least one memory array containing a plurality of memory cells arranged in rows and columns;
   a DC sense amplifier having first and second inputs and an output coupled to an externally accessible data terminal of the memory device;
   a pair of I/O lines coupled to the inputs of the DC sense amplifier;
   a plurality of pairs of complementary digit lines for each column that may be coupled to the pair of I/O lines; and
   a test circuit for facilitating the testing of the memory device, the testing circuit selectively operating in either a normal mode or a test mode, the testing circuit, when operating in the normal mode, coupling the inputs of the DC sense amplifier to the pair of digit lines for one column of the array, and the testing circuit, when operating in the test mode, coupling one of the inputs of the DC sense amplifier to a first plurality of digit lines of the array and another of the inputs of the DC sense amplifier to a second plurality of digit lines for the array.

2. The memory device of claim 1 wherein the second plurality of digit lines comprise complements of the first plurality of digit lines.

3. The memory device of claim 1, further comprising a NOR gate having a first input coupled to the first input of the DC sense amplifier and a second input coupled to the second input of the DC sense amplifier, an output of the NOR gate indicating a failed memory cell when both inputs to the NOR gate are at logic "1."

4. The memory device of claim 1, further comprising:
   a first weak latch coupled to the first input of the DC sense amplifier; and
   a second weak latch coupled to the second input of the DC sense amplifier.

5. The memory device of claim 1 wherein the DC sense amplifier comprises:
   a first current mirror amplifier having an input coupled to the first input of the DC sense amplifier and having first and second outputs;
   a second current mirror amplifier having an input coupled to the second input of the DC sense amplifier and having first and second outputs;
   a third current mirror amplifier having a first input coupled to the first output of the first current mirror amplifier and an output coupled to the first output of the second current mirror amplifier and to a first output of the DC sense amplifier; and
   a fourth current mirror amplifier having a first input coupled to the second output of the first current mirror amplifier and an output coupled to the second output of the second current mirror amplifier and to a second output of the DC sense amplifier.

6. The test circuit of claim 1 wherein the columns for the digit lines that the switching circuit couples to inputs of the DC sense amplifier in the test mode are in different arrays of the memory device.

7. The test circuit of claim 1 wherein the switching circuit comprises a plurality of pass gates coupling the pair of I/O lines to a pair of complementary digit lines for a first array and a pair of complementary digit lines for a second array.

8. The test circuit of claim 1 wherein the switching circuit comprises a plurality of pass gates coupling the pair of I/O lines to a pair of complementary digit lines for a first column and a pair of complementary digit lines for a second column.

9. The test circuit of claim 1 wherein the memory device comprises a dynamic random access memory.

10. The memory device of claim 1 wherein, in the test mode, the switching circuit couples complementary digit lines for the first and second arrays corresponding to memory cells in the first and second arrays that are both replaceable as a group by rows or columns of redundant or spare memory cells.

11. The memory device of claim 1 wherein the DC sense amplifier comprises:
- a first differential amplifier having an input coupled to the first input of the DC sense amplifier and first and second outputs each having a gain of $\alpha_1$;
- a second differential amplifier having an input coupled to the second input of the DC sense amplifier and first and second outputs each having a gain of $\alpha_1$; and
- a third differential amplifier having a first input coupled to the first output of the first differential amplifier and an output coupled to the second output of the second differential amplifier, the third differential amplifier configured to provide a gain of $\alpha_2$ and an output signal coupled to a first output of the DC sense amplifier that is $\alpha_1$ times the signal at the first input of the DC sense amplifier minus $\alpha_1\alpha_2$ times the signal at the second input of the DC sense amplifier.

12. The memory device of claim 11, further comprising a fourth differential amplifier having a first input coupled to the second output of the first differential amplifier and an output coupled to the first output of the second differential amplifier, the fourth differential amplifier configured to provide a gain of $\alpha_2$ and an output signal coupled to a second output of the DC sense amplifier that is $\alpha_1$ times the signal at the second input of the DC sense amplifier minus $\alpha_1\alpha_2$ times the signal at the first input of the DC sense amplifier.

13. In a memory device:
- at least one memory array containing a plurality of memory cells arranged in rows and columns;
- a DC sense amplifier having first and second inputs and an output coupled to an externally accessible data terminal of the memory device;
- a pair of I/O lines coupled to the inputs of the DC sense amplifier;
- a plurality of pairs of complementary digit lines for each column that may be coupled to the pair of I/O lines; and
- a test circuit for facilitating the testing of the memory device, comprising:
  - a switching circuit coupled between the inputs of the DC sense amplifier and a pair of digit lines for one column of the array and between the inputs of the DC sense amplifier and a pair of digit lines for another column of the array, the switching circuit selectively operating in either a normal mode or a test mode, the switching circuit, when operating in the normal mode, coupling the inputs of the DC sense amplifier to the pair of digit lines for one column of the array, and the switching circuit, when operating in the test mode, coupling one of the inputs of the DC sense amplifier to a first plurality of pairs of digit lines of the array and another of the inputs of the DC sense amplifier to a second plurality of pairs of digit lines for the array; and
  - a NOR gate having a first input coupled to the first input of the DC sense amplifier and a second input coupled to the second input of the DC sense amplifier, an output of the NOR gate indicating a failed memory cell when both inputs to the NOR gate are at logic "0."

14. The memory device of claim 13 wherein the second plurality of digit lines comprise complements of the first plurality of pairs of digit lines.

15. The memory device of claim 13, further comprising:
- a first weak latch coupled to the first input of the direct sense amplifier; and
- a second weak latch coupled to the second input of the direct sense amplifier.

16. The memory device of claim 13 wherein the DC sense amplifier comprises:
- a first current mirror amplifier having an input coupled to the first input of the DC sense amplifier and having first and second outputs;
- a second current mirror amplifier having an input coupled to the second input of the DC sense amplifier and having first and second outputs;
- a third current mirror amplifier having a first input coupled to the first output of the first current mirror amplifier and an output coupled to the first output of the second current mirror amplifier and to a first output of the DC sense amplifier; and
- a fourth current mirror amplifier having a first input coupled to the second output of the first current mirror amplifier and an output coupled to the second output of the second current mirror amplifier and to a second output of the DC sense amplifier.

17. The test circuit of claim 13 wherein the columns for the digit lines that the switching circuit couples to inputs of the DC sense amplifier in the test mode are in different arrays of the memory device.

18. The test circuit of claim 13 wherein the switching circuit comprises a plurality of pass gates coupling the pair of I/O lines to a pair of complementary digit lines for a first array and a pair of complementary digit lines for a second array.

19. The test circuit of claim 13 wherein the switching circuit comprises a plurality of pass gates coupling the pair of I/O lines to a pair of complementary digit lines for a first column and a pair of complementary digit lines for a second column.

20. The test circuit of claim 13 wherein the memory device comprises a dynamic random access memory.

21. The memory device of claim 13 wherein, in the test mode, the switching circuit couples complementary digit lines for the first and second arrays corresponding to memory cells in the first and second arrays that are both replaceable as a group by rows or columns of redundant or spare memory cells.

22. The memory device of claim 13 wherein the DC sense amplifier comprises:
- a first differential amplifier having an input coupled to the first input of the DC sense amplifier and first and second outputs each having a gain of $\alpha_1$;
- a second differential amplifier having an input coupled to the second input of the DC sense amplifier and first and second outputs each having a gain of $\alpha_1$; and
- a third differential amplifier having a first input coupled to the first output of the first differential amplifier and an output coupled to the second output of the second differential amplifier, the third differential amplifier configured to provide a gain of $\alpha_2$ and an output signal coupled to a first output of the DC sense amplifier that is $\alpha_1$ times the signal at the first input of the DC sense amplifier minus $\alpha_1\alpha_2$ times the signal at the second input of the DC sense amplifier.

23. The memory device of claim 22, further comprising a fourth differential amplifier having a first input coupled to the second output of the first differential amplifier and an output coupled to the first output of the second differential amplifier, the fourth differential amplifier configured to provide a gain of $\alpha_2$ and an output signal coupled to a second output of the DC sense amplifier that is a $\alpha_1$ times the signal at the second input of the DC sense amplifier minus $\alpha_1\alpha_2$ times the signal at the first input of the DC sense amplifier.

24. A memory device having an address bus and a data terminal, comprising:

at least one array of memory cells arranged in rows and columns, each of the rows having a row line and each of the columns having a pair of complementary digit lines;

a row address circuit coupled to the address bus for activating a row line corresponding to a row address coupled to the row address circuit through the address bus;

a column address circuit coupled to the address bus for coupling to a pair of I/O lines a pair of digit lines for a column corresponding to a column address coupled to the column address circuit through the address bus;

a DC sense amplifier having a pair of inputs and an output coupled to the data terminal of the memory device; and a switching circuit operating in a normal mode to couple the inputs of the DC sense amplifier to a pair of digit lines for the same column and operating in a test mode to couple the inputs of the DC sense amplifier to a plurality of digit lines for different columns.

25. The memory device of claim 24 wherein the different columns are in different arrays of the memory device.

26. The memory device of claim 24 wherein the memory device comprises a dynamic random access memory.

27. The memory device of claim 24, further comprising a NOR gate having a first input coupled to the first input of the DC sense amplifier and a second input coupled to the second input of the DC sense amplifier, an output of the NOR gate indicating a failed memory cell when both inputs of the NOR gate are in the same logical state.

28. The memory device of claim 27 wherein, in the test mode, the switching circuit couples I/O lines for first and second arrays corresponding to memory cells in the first and second arrays that are replaceable as a group by rows or columns of redundant memory cells.

29. A memory device having an address bus and a data terminal, comprising:

first and second arrays of memory cells in which the memory cells in each array are arranged in rows and columns, each of the rows having a row line and each of the columns having a pair of complementary digit lines;

a row address circuit coupled to the address bus for activating a row line in one of the arrays corresponding to a row address applied to the row address circuit through the address bus;

a column address circuit coupled to the address bus for coupling a respective pair of I/O lines for each array to a pair of digit lines corresponding to a column address applied to the column address circuit through the address bus;

a DC sense amplifier having a pair of inputs coupled to the pair of I/O lines and an output coupled to the data terminal of the memory device; and a switching circuit operating in a normal mode to couple the I/O lines for either the first or the second arrays to the complementary digit lines and operating in a test mode to couple each of the I/O lines for the first array to the complementary digit lines and to couple each of the I/O lines for the second array to the complementary digit lines.

30. The memory device of claim 29 wherein the memory device comprises a dynamic random access memory.

31. The memory device of claim 29, further comprising combinatorial logic having a first input coupled to a first of the pair of inputs to the DC sense amplifier and a second input coupled to a second of the pair of inputs to the DC sense amplifier, the combinatorial logic providing an output signal indicative of a defective memory cell when both the first and second inputs to the DC sense amplifier are in the same logical state.

32. The memory device of claim 29 wherein, in the test mode, the switching circuit couples digit lines for the first and second arrays corresponding to memory cells in the first and second arrays that are replaceable as a group by rows or columns of redundant memory cells.

33. A system for testing a memory device having an array of memory cells arranged in rows and columns, each of the columns having a pair of complementary digit lines, addressing circuits coupled to an address bus for selecting memory cells to which data are written and from which data are read, and a DC sense amplifier having an output coupled to a data terminal of the memory device, the test system comprising:

a multiplexer included in the memory device, the multiplexer being controlled by a mode signal to operate in either a normal mode or a test mode, the multiplexer operating in the normal mode to couple digit lines of the same column to respective inputs of the DC sense amplifier and operating in a test mode to couple digit lines of a plurality of columns to respective inputs of the DC sense amplifier;

a mode control circuit included in the memory device, the mode control circuit having an output terminal and a plurality of input terminals coupled to externally accessible input terminals of the memory device, the mode control circuit generating a mode control signal to cause the multiplexer to operate in the normal mode responsive to a first combination of signals applied to the externally accessible input terminals and generating a mode control signal to cause the multiplexer to operate in the test mode responsive to a second combination of signals applied to the externally accessible input terminals; and a testing device external to the memory device, the testing device including addressing circuits for applying addresses to the address bus of the memory device, a mode controller for selectively applying the first and second combinations of signals to the externally accessible input terminals of the memory device, a data generating circuit to apply background data to the data terminal of the memory device, and a data analyzing circuit for examining read data coupled from the data terminal of the memory device in the test mode to determine if the read data corresponds to the write data.

34. The test system of claim 33 wherein the different columns for which the digit lines are coupled to the inputs of the DC sense amplifier in the test mode are in different arrays of the memory device.

35. The test system of claim 33 wherein the memory device comprises a dynamic random access memory.

36. The test system of claim 33 wherein the memory device further comprises a NOR gate having a first input coupled to the first input of the DC sense amplifier and a second input coupled to the second input of the DC sense amplifier, so that, when the multiplexer is in the test mode, an output of the NOR gate indicates a defective memory cell when the first and second inputs to the NOR gate are in the same logical state.

37. A computer system, comprising:
a processor having a processor bus;
an input device coupled to the processor through the processor bus and adapted to allow data to be entered into the computer system;
an output device coupled to the processor through the processor bus and adapted to allow data to be output from the computer system; and
a memory device coupled to the processor through the processor bus, the memory device comprising:
 at least one array of memory cells arranged in rows and columns, each of the rows having a row line and each of the columns having a pair of complementary digit lines;
 a row address circuit adapted to receive and decode a row address, and to select a row of memory cells corresponding to the row address;
 a column address circuit adapted to couple a pair of digit lines for a column corresponding to a column address to a pair of I/O lines to receive or apply data to one of the memory cells in the selected row corresponding to a column address;
 a data path circuit adapted to couple data between an external data terminal and each of a plurality of pairs of complementary digit lines for respective columns; the data path circuit including a DC sense amplifier having a pair of inputs and an output coupled to the external data terminal of the memory device; and
 a multiplexer operating in a normal mode to couple the inputs of the DC sense amplifier through a pair of the I/O lines to a pair of digit lines for the same column and operating in a test mode to couple the inputs of the DC sense amplifier through a pair of the I/O lines to a plurality of pairs of digit lines for different columns.

38. The computer system of claim 37 wherein the different columns for which the digit lines are coupled to the inputs of the DC sense amplifier in the test mode are in different arrays of the memory device.

39. The computer system of claim 37 wherein the memory device comprises a dynamic random access memory.

40. The computer system of claim 37, further comprising a NOR gate having inputs coupled to the digit lines, an output of the NOR gate indicating a defective memory cell when both digit lines are at logical "0."

41. A computer system, comprising:
a processor having a processor bus;
an input device coupled to the processor through the processor bus and adapted to allow data to be entered into the computer system;
an output device coupled to the processor through the processor bus adapted to allow data to be output from the computer system; and
a memory device coupled to the processor through the processor bus, the memory device comprising:
 first and second arrays of memory cells in which the memory cells in each array are arranged in rows and columns, each of the rows having a row line and each of the columns having a pair of complementary digit lines;
 a row address circuit coupled to the address bus for activating a row line in one of the arrays corresponding to a row address applied to the row address circuit through the address bus;
 a column address circuit coupled to the address bus for coupling a respective pair of I/O lines for each array to a pair of digit lines corresponding to a column address applied to the column address circuit through the address bus;
 a data path circuit adapted to couple data between an external data terminal and each of a plurality of pairs of complementary digit lines for respective columns, the data path circuit including a DC sense amplifier having a pair of inputs coupled to a pair of data lines and an output coupled to the external data terminal of the memory device; and
 a multiplexer operating in a normal mode to couple the I/O lines for either the first or the second arrays to the pair of data lines, respectively, and operating in a test mode to couple the I/O lines for the first array to the data lines and to couple the I/O lines for the second array to the data lines.

42. The computer system of claim 41 wherein the memory device comprises a dynamic random access memory.

43. The computer system of claim 41, further comprising:
a first weak latch coupled to the first input of the direct sense amplifier;
a second weak latch coupled to the second input of the direct sense amplifier; and
combinatorial logic having a first input coupled to a first of the data lines and a second input coupled to a second of the data lines, the combinatorial logic providing an output signal indicative of a defective memory cell when both of the data lines are in the same logical state.

44. A method of testing a memory array comprising:
writing background data to the memory array;
coupling complementary digit lines for multiple columns in the memory array to inputs of a DC sense amplifier; and
simultaneously reading read data from multiple columns of the memory array.

45. The method of claim 44, further comprising generating an output signal from a NOR gate having inputs coupled to the inputs of the DC sense amplifier indicative of a defective memory cell when the inputs to the NOR gate are both logic "0."

46. The method of claim 44 wherein simultaneously reading read data from multiple columns of the memory array comprises simultaneously reading read data from multiple memory cells in different columns of the memory array where the multiple memory cells are collectively replaceable as a group by rows or columns of redundant memory cells.

47. The method of claim 44, further comprising replacing multiple memory cells, at least one of which was determined to be defective based on simultaneously reading data from the multiple columns of the memory array, with redundant memory cells by blowing a fuse.

48. The method of claim 44 wherein simultaneously reading read data from the multiple columns of the memory array comprises:
reading first read data from a first column;
reading second read data from a second column;
compressing the first and second read data to provide compressed read data; and
generating an output signal indicative of a defective memory cell when the digit line and the digit line complement representative of the compressed read data are both logic "0."

49. A method for testing a memory array comprising:

storing background data in the memory array;

simultaneously reading read data from multiple memory cells in the memory array;

coupling the read data from the multiple memory cells to a pair of common complementary digit lines; and detecting a defective memory cell when both of the pair of common complementary digit lines are in the same logical state.

50. The method of claim 49 wherein coupling the read data from the multiple memory cells to a pair of common digit lines includes combining the read data from multiple memory cells using a wired-OR interconnection.

51. A method for testing a memory integrated circuit comprising:

writing background data to memory cells in the memory integrated circuit;

coupling a first column of a memory array in the memory integrated circuit to inputs of a DC sense amplifier;

coupling a second column of the memory array to the inputs of the DC sense amplifier;

reading read data from a first memory cell in the first column; and simultaneously reading read data from a second memory cell in the second column.

52. The method of claim 51, further comprising detecting that at least one of the memory cells in the first and second columns has failed when both digit lines coupled to the first and second columns are in the same logical state.

53. The method of claim 52, further comprising, when at least one memory cell is defective:

writing second background data to the first and second memory cells;

coupling the first column of a memory array in the memory integrated circuit to inputs of the DC sense amplifier;

reading second read data from the first memory cell;

determining if the first memory cell is defective;

coupling the second column of the memory array to the inputs of the DC sense amplifier;

reading second read data from the second memory cell; and determining if the second memory cell is defective.

54. A method of combining data from multiple memory cells comprising:

writing background data to first and second memory cells;

reading the first memory cell to provide first memory data;

reading the second memory cell to provide second memory data;

combining the first and second memory data to provide compressed memory data such that when the first and second memory data disagree, both a first digit line carrying a signal representative of the compressed memory data and a second digit line that is normally the complement of the first digit line have the same logical state.

55. The method of claim 54 wherein combining the first and second memory data comprises wired-ORing of the first and second memory data.

* * * * *